US010236906B2

(12) United States Patent
Probel et al.

(10) Patent No.: US 10,236,906 B2
(45) Date of Patent: Mar. 19, 2019

(54) COMPRESSION AND TIMELY DELIVERY OF WELL-TEST DATA

(71) Applicant: Schlumberger Technology Corporation, Sugar Land, TX (US)

(72) Inventors: Clement Probel, Issy-les-Moulineaux (FR); Carlos Merino, Paris (FR); Julius Kusuma, Somerville, MA (US); Andriy Gelman, Somerville, MA (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 1004 days.

(21) Appl. No.: 14/060,590

(22) Filed: Oct. 22, 2013

(65) Prior Publication Data

US 2015/0109140 A1 Apr. 23, 2015

(51) Int. Cl.
*G01V 3/00* (2006.01)
*H03M 7/30* (2006.01)

(52) U.S. Cl.
CPC ..................................... *H03M 7/30* (2013.01)

(58) Field of Classification Search
CPC ............................... H03M 7/30; E21B 47/12
USPC ...................................................... 340/855.4
See application file for complete search history.

(56) References Cited

U.S. PATENT DOCUMENTS

| | | | | |
|---|---|---|---|---|
| 5,247,357 A | * | 9/1993 | Israelsen | H03M 7/3082 341/106 |
| 5,331,414 A | * | 7/1994 | Golin | H04N 19/80 348/390.1 |
| 5,745,392 A | | 4/1998 | Ergas et al. | |
| 5,933,790 A | | 8/1999 | Jeffryes | |
| 5,936,859 A | * | 8/1999 | Huang | G06T 3/4007 375/354 |
| 6,308,137 B1 | | 10/2001 | Underhill et al. | |
| 6,405,136 B1 | | 6/2002 | Li et al. | |

(Continued)

FOREIGN PATENT DOCUMENTS

WO 2005/096016 10/2005

OTHER PUBLICATIONS

Allen Gersho and Robert M. Gray, "Vector Quantization and Signal Compression," The Springer International Series in Engineering and Computer Science, Nov. 30, 1991.

(Continued)

*Primary Examiner* — Amine Benlagsir
(74) *Attorney, Agent, or Firm* — Cameron R. Sneddon; Diana M. Sangalli

(57) ABSTRACT

A modem is described having a transceiver assembly, a non-transitory processor readable medium coupled to the transceiver assembly, transceiver electronics coupled to the transceiver and the non-transitory processor readable medium, and a power supply supplying power to the transceiver assembly and the transceiver electronics. The transceiver electronics are configured to calculate a size of an output bit stream based on an encoding scheme to encode for transmission data stored in the non-transitory processor readable medium, decimate the data if the size of the output bit stream exceeds a predetermined size, recalculate the size of the output bit stream, after decimation of the data, based on the encoding scheme to encode for transmission the decimated data, and encode the data using the encoding scheme.

18 Claims, 7 Drawing Sheets

(56) References Cited

U.S. PATENT DOCUMENTS

| | | | |
|---|---|---|---|
| 6,594,394 | B1 | 7/2003 | Stromberg et al. |
| 7,107,153 | B2 * | 9/2006 | Kisra ................. G01V 3/34 |
| | | | 702/6 |
| 7,689,637 | B1 | 3/2010 | Gomstein et al. |
| 8,024,121 | B2 | 9/2011 | Tang |
| 8,305,243 | B2 | 11/2012 | Yu et al. |
| 8,358,220 | B2 * | 1/2013 | Savage ............. G01V 11/002 |
| | | | 340/853.1 |
| 8,358,559 | B2 | 1/2013 | Mansour |
| 8,695,429 | B2 * | 4/2014 | Urbano ............ G01S 7/52073 |
| | | | 73/602 |
| 8,855,011 | B2 | 10/2014 | Ortega et al. |
| 2001/0017594 | A1 * | 8/2001 | Ahn .................. G11B 20/14 |
| | | | 341/59 |
| 2003/0026169 | A1 * | 2/2003 | Schultz ................ E21B 47/16 |
| | | | 367/83 |
| 2003/0118240 | A1 * | 6/2003 | Satoh .................. H04N 19/176 |
| | | | 382/239 |
| 2005/0222775 | A1 * | 10/2005 | Kisra ................. G01V 3/34 |
| | | | 702/14 |
| 2006/0062249 | A1 * | 3/2006 | Hall .................. E21B 47/12 |
| | | | 370/468 |
| 2007/0112521 | A1 * | 5/2007 | Akimov ............... G01V 11/00 |
| | | | 702/6 |
| 2007/0198192 | A1 * | 8/2007 | Hsu ................... E21B 47/12 |
| | | | 702/6 |
| 2009/0192711 | A1 | 7/2009 | Tang |
| 2010/0188253 | A1 * | 7/2010 | Shearer ............... E21B 47/18 |
| | | | 340/853.3 |
| 2011/0205895 | A1 * | 8/2011 | Chen ................. H04L 47/10 |
| | | | 370/231 |
| 2011/0317045 | A1 * | 12/2011 | Vakrat ............... G06T 5/002 |
| | | | 348/242 |
| 2012/0014289 | A1 | 1/2012 | Ortega et al. |
| 2012/0027318 | A1 | 2/2012 | Hinds |
| 2012/0250461 | A1 * | 10/2012 | Millot ................ H04B 11/00 |
| | | | 367/82 |
| 2012/0320978 | A1 * | 12/2012 | Ameres ............. H04N 19/00066 |
| | | | 375/240.12 |
| 2013/0307700 | A1 | 11/2013 | Hassan et al. |
| 2014/0367092 | A1 * | 12/2014 | Roberson ............. E21B 47/00 |
| | | | 166/250.01 |

OTHER PUBLICATIONS

A.Y. Djourik, et al, "Siberian Solar Radiotelescope: the PCA format of the SSRT data compressor", Sep. 21, 2003, pp. 278-282.

M. Hans, et al, "Lossless Compression of Digital Audio," Hewlett Packard Technical Report, CSIP TR-97-07, Nov. 1999.

T. Robinson, "Shorten: Simple lossless and near-lossless waveform compression," Cambridge University Engineering Department Technical Report, CUED/F-INFENG/TR.156, Dec. 1994.

R.F. Rice, "Some practical universal noiseless coding techniques," JetPropulsion Laboratory Technical Report, JPL-79-22, Pasadena, Mar. 15, 1979.

G. Mandyam, et al, "Lossless Seismic Data Compression using Adaptive Linear Prediction," Geoscience and Remote Sensing Symposium, 1996. IGARSS '96. 'Remote Sensing for a Sustainable Future.', International (vol. 2 ), May 27-31, 1996, pp. 1029-1031.

P.C. Craven, et al., "Lossless Compression Using IIR Prediction Filters," at https://secure.aes.org/forum/pubs/conventions/?elib=7364.

TTA Lossless Audio Codec-True Audio Compressor Algorithms.

I.H. Witten, R.M. Neal, J.G. Cleary, "Arithmetic coding for data compression," Communications of the ACM Magazine, vol. 30, Issue 6, pp. 520-540, Jun. 1987.

Elias, Peter (Mar. 1975), "Universal codeword sets and representations of the integers," IEEE Transactions on Information Theory 21 (2): 194-203.

P. Breton et al., "Well Positioned Seismic Measurements," Oilfield Review, pp. 32-45, Spring, 2002.

Pistre et al., "A New Sonic Modular Tool Provides Complete Acoustic Formation Characterization", 2005 Society of Exploration Geophysicists International Exposition and Annual Meeting Proceedings, SEG, Houston, Nov. 6-11, 2005 (5 pages).

International Preliminary Report on Patentability issued in the related PCT Application PCT/US2014/016162 dated Aug. 18, 2015 (5 pages).

International search report and written opinion for the equivalent PCT patent application No. PCT/US2014/016162, dated May 20, 2014 (9 pages).

* cited by examiner

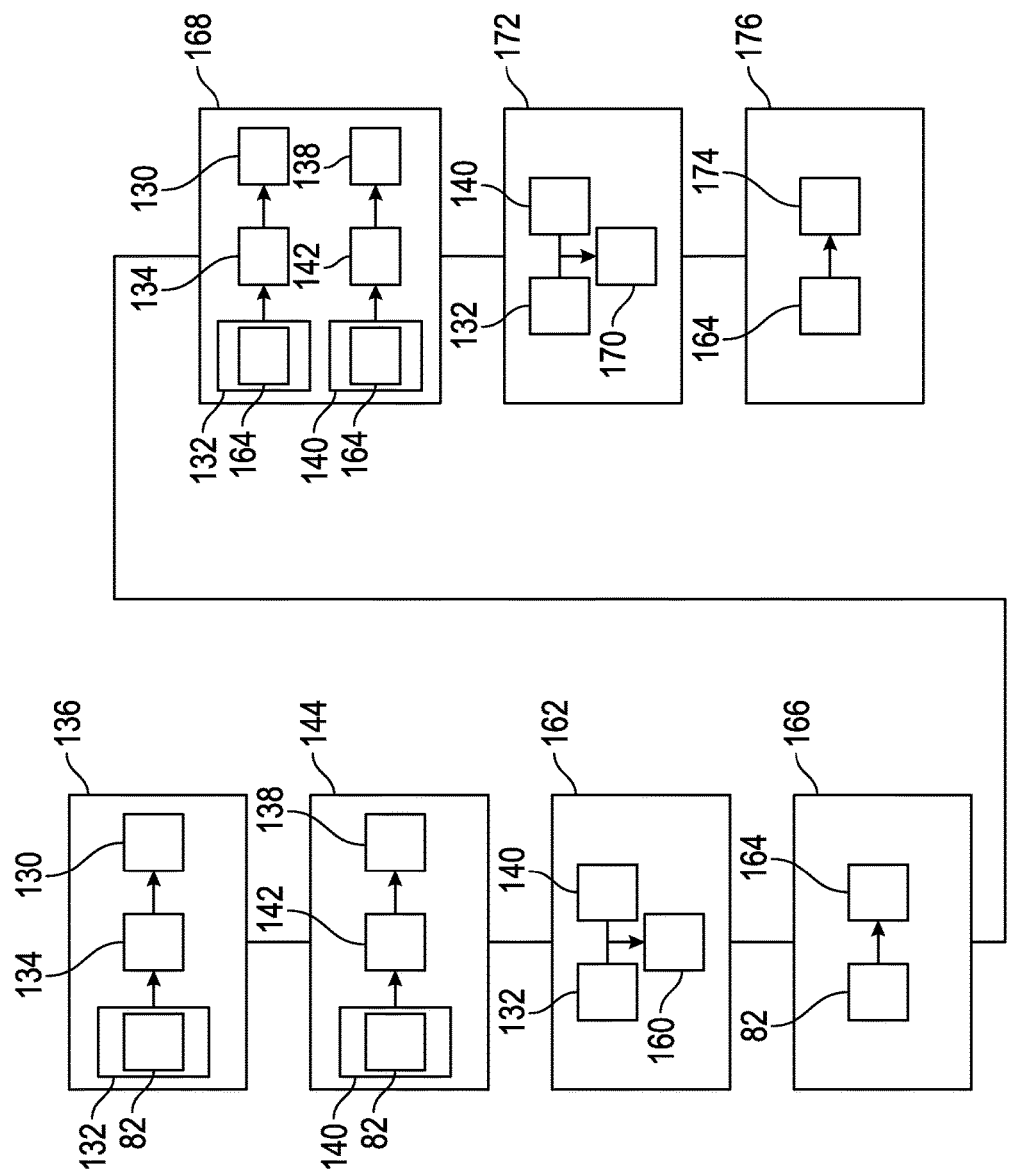

COMPRESSION AND TIMELY DELIVERY OF WELL-TEST DATA

BACKGROUND

This disclosure relates to downhole tools, and more particularly to methods and apparatuses for downhole communication between tools.

DESCRIPTION OF THE RELATED ART

One of the more difficult problems associated with any borehole is to communicate measured data between one or more locations down a borehole and the surface, or between downhole locations themselves. For example, in the oil and gas industry it is desirable to communicate data generated downhole to the surface during operations such as drilling, perforating, fracturing, and drill stem or well testing; and during production operations such as reservoir evaluation testing, pressure and temperature monitoring. Communication is also desired to transmit intelligence from the surface to downhole tools, equipment, or instruments to effect, control or modify operations or parameters.

Accurate and reliable downhole communication is desired when complex data comprising a set of measurements or instructions is to be communicated, i.e., when more than a single measurement or a simple trigger signal has to be communicated. For the transmission of complex data it is often desirable to communicated encoded digital signals.

Communication, between downhole locations and the surface, or between downhole locations themselves, often employs compression methods to compress data transmitted between the locations. U.S. Pat. No. 7,107,153 describes a compression method for sonic waveforms where multiple compression schemes are tested and chosen based on certain parameters. PAQ data compression may also be used providing a lossless compression package which tests multiple compression schemes and chooses one based on certain parameters.

In some existing systems, a downhole modem serves as a relay for user commands from the surface. Data points transmitted by the downhole modem may be equally distributed in order to save bandwidth, where a time of a first point and a time-span between points are included as side information in a message transmitted by the downhole modem. In some existing systems, a number of points per message is constrained. A maximal number of points per message is derived from a worst case, such as a number of bits used to encode a point with full precision and without compression. In existing systems, periodic requests are sent from the surface downhole, and for each request, the time span is calculated such that the points are well-distributed between a time of a last point received and a present time.

It may be beneficial to have a method for data compression and a downhole modem configured to perform lossless or near-lossless compression, constrained by a parameter specified by a surface user, where multiple compression schemes may be tested and the compression scheme in compliance with the parameter specified by the user is chosen for encoding the message. It may also be beneficial to interrogate sensors with a downhole modem, continuously performing dynamic mapping of sensor data, such that upon receiving a query from the surface, the sensor data is available and ready for compression.

SUMMARY

In one aspect, some embodiments of the present disclosure are directed to a modem. The modem is described having a transceiver assembly, a non-transitory processor readable medium coupled to the transceiver assembly, transceiver electronics coupled to the transceiver and the non-transitory processor readable medium, and a power supply supplying power to the transceiver assembly and the transceiver electronics. The non-transitory processor readable medium has a buffer storing data from a downhole sensor. The transceiver electronics calculate a size of an output bit stream based on an encoding scheme to encode for transmission data stored in the non-transitory processor readable medium, decimate the data stored in the buffer if the size of the output bit stream exceeds a predetermined size, recalculate the size of the output bit stream, after decimation of the data stored in the buffer, based on the encoding scheme to encode for transmission the decimated data stored in the buffer, and encode the data stored in the buffer using the encoding scheme.

In some embodiments, a modem is described for communication in a network via a communication channel. The modem is described as having a transceiver assembly, a non-transitory processor readable medium coupled to the transceiver assembly, transceiver electronics coupled to the transceiver and the non-transitory processor readable medium, and a power supply supplying power to the transceiver assembly and the transceiver electronics. The non-transitory processor readable medium has a buffer storing data from a downhole sensor. The transceiver electronics calculate a size of an output bit stream based on an encoding scheme to encode for transmission data stored in the non-transitory processor readable medium. The transceiver electronics decimate the data stored in the buffer if the size of the output bit stream exceeds a predetermined size; recalculate the size of the output bit stream, after decimation, based on the encoding scheme to encode for transmission the decimated data stored in the buffer; and encode the data stored in the buffer using the encoding scheme.

In some embodiments a modem is described for communication in a network via a communication channel. The modem is described as having a transceiver assembly, a non-transitory processor readable medium coupled to the transceiver assembly, transceiver electronics coupled to the transceiver and the non-transitory processor readable medium, and a power supply supplying power to the transceiver assembly and the transceiver electronics. The non-transitory processor readable medium has a buffer storing data samples indicative of measurements from a downhole sensor in communication with the transceiver assembly. The transceiver electronics calculate a number of data samples stored in the buffer able to be encoded into a predetermined budget by a first encoding scheme and a second encoding scheme. The transceiver electronics determine which of the first encoding scheme and the second encoding scheme enables encoding of a larger number of the number of data samples within the predetermined budget. The transceiver electronics then select the encoding scheme enabling encoding of the larger number of the number of data samples within the predetermined budget and encode the number of data samples stored in the buffer using a selected encoding scheme of the first encoding scheme and the second encoding scheme.

In another aspect, some embodiments of the present disclosure are directed to a method for encoding and compression of data. The method includes a processor calculating a size of an output bit stream based on an encoding scheme to encode for transmission data stored in a buffer. The data is indicative of measurements of a downhole environment by a downhole sensor. The method is further performed by the processor decimating the data stored in the buffer if the size of the output bit stream exceeds a predetermined size. The processor then recalculates the size of the output bit stream, after decimation of the data stored in the buffer, based on the encoding scheme to encode for transmission the decimated data stored in the buffer. The processor then encodes the data stored in the buffer using the encoding scheme.

In some embodiments, the method includes a processor calculating a first size of a first output bit stream based on a first encoding scheme to encode, for transmission, data stored in a buffer. The data is indicative of measurements of a downhole environment by a downhole sensor. The processor calculates a second size of a second output bit stream based on a second encoding scheme to encode, for transmission, the data stored in the buffer. The method is further performed by the processor selecting a selected encoding scheme based upon relative sizes of the first bit stream and the second bit stream. The selected encoding scheme is either the first encoding scheme or the second encoding scheme. The processor then encodes the data stored in the buffer using the selected encoding scheme.

In some embodiments, the method is performed by the processor calculating a number of data samples stored in a buffer able to be encoded into a predetermined budget by a first encoding scheme and a second encoding scheme. The data samples are indicative of measurements of a downhole environment by a downhole sensor. The processor determines which of the first encoding scheme and the second encoding scheme enables encoding a larger number of the number of data samples within the predetermined budget. The processor then selects the first encoding scheme or the second encoding scheme enabling encoding of the larger number of the number of data samples within the predetermined budget. The processor then encodes the number of data samples stored in the buffer using a selected encoding scheme of the first encoding scheme and the second encoding scheme.

In yet another aspect, some embodiments of the present disclosure are directed to methods for sensor interrogation. As such, a method is described in which a processor performs a query on a sensor, for data collected by the sensor, at predetermined instants of time by a downhole modem operably coupled to the sensor, prior to receiving a request for transmission of the data from a surface modem. The method is further performed by the processor receiving data from the sensor in response to the query and storing the data in a buffer coupled to the downhole modem.

BRIEF DESCRIPTION OF THE DRAWINGS

So that the manner in which the above recited features can be understood in detail, a more particular description may be had by reference to embodiments, some of which are illustrated in the appended drawings, wherein like reference numerals denote like elements. It should be understood, however, that the appended drawings illustrate some embodiments and are therefore not to be considered limiting of its scope, and may admit to other equally effective embodiments.

FIG. 7 shows a diagrammatic representation of another embodiment of the encoding and compression scheme shown in FIG. 6.

DETAILED DESCRIPTION

Figure 1:
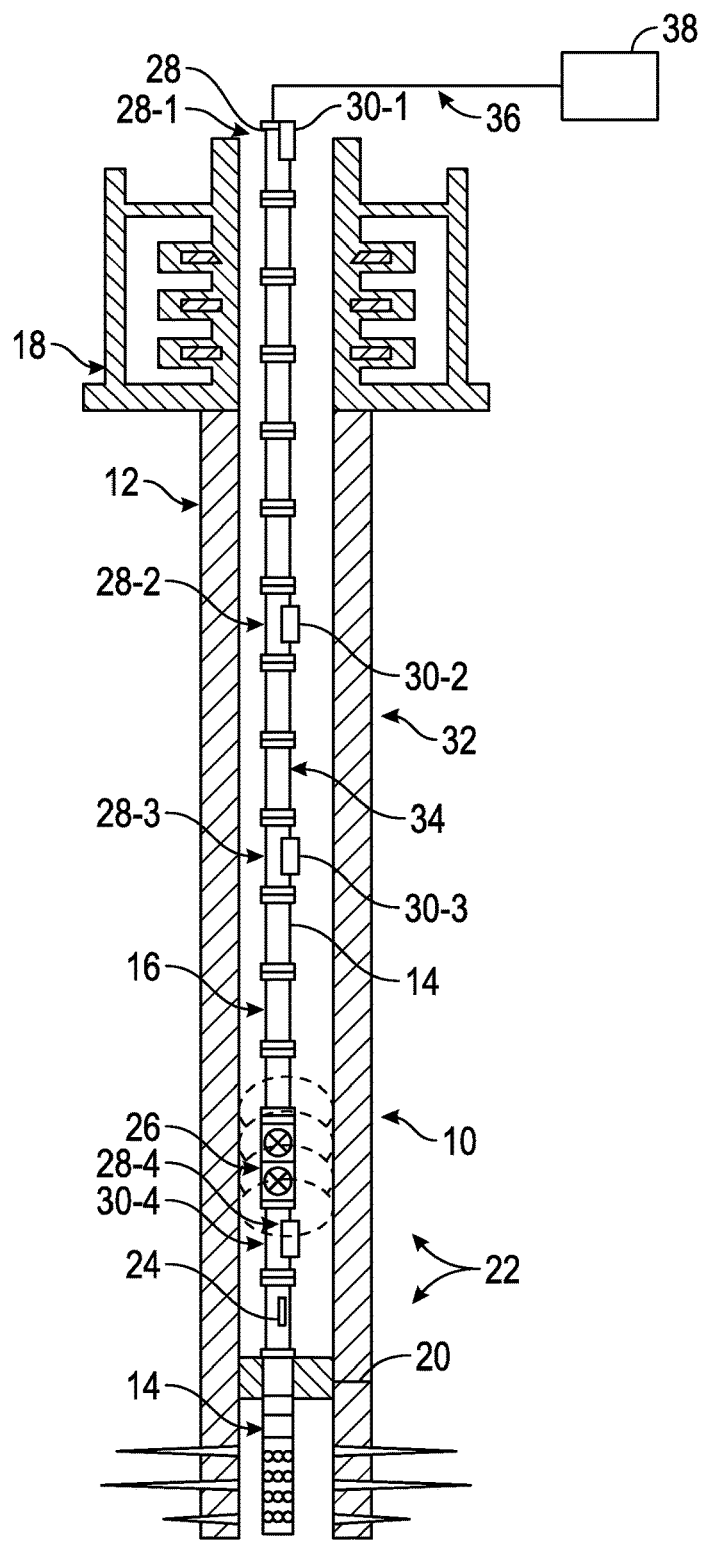
FIG. 1 shows a schematic view of a downhole telemetry system in accordance with the present disclosure.

In the following description, numerous details are set forth to provide an understanding of the present disclosure. It will be understood by those skilled in the art, however, that the embodiments of the present disclosure may be practiced without these details and that numerous variations or modifications from the described embodiments may be possible. In other instances, well-known features have not been described in detail to avoid unnecessarily complicating the description.

In the specification and appended claims: the terms "connect", "connection", "connected", "in connection with", and "connecting" are used to mean "in direct connection with" or "in connection with via one or more elements"; and the term "set" is used to mean "one element" or "more than one element". Further, the terms "couple", "coupling", "coupled", "coupled together", and "coupled with" are used to mean "directly coupled together" or "coupled together via one or more elements". As used herein, the terms "up" and "down", "upper" and "lower", "upwardly" and "downwardly", "upstream" and "downstream"; "above" and "below"; and other like terms indicating relative positions above or below a given point or element are used in this description to more clearly describe some embodiments of the disclosure.

The terminology and phraseology used herein is for descriptive purposes and should not be construed as limiting in scope. Language such as "including," "comprising," "having," "containing," or "involving," and variations thereof, is intended to be broad and encompass the subject matter listed thereafter, equivalents, and additional subject matter not recited or inherently present therein.

Unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concepts. This description should be read to include one or at least one and the singular also includes the plural unless it is obvious that it is meant otherwise.

Further, as used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment, although the inventive concepts disclosed herein are intended to encompass any and all combinations and permutations of the features of the embodiments described herein.

The present disclosure generally involves a system and methodology to perform lossless or near-lossless data compression and sensor interrogation. The methodology may be used in conjunction with a modem and/or in the context of wireless downhole testing telemetry. The system may compress data measured by a downhole sensor before sending the data to the surface. In some embodiments, the compression system and methodology may be stored on a downhole modem. The data compression may be constrained by a parameter specified by a surface user. In some embodiments, multiple compression schemes may be tested and the compression scheme with the highest quality performance may be used for encoding the data to be sent to the surface. In some embodiments, multiple-scheme compression may be particularly suited for bandwidth-constrained environments. The sensor interrogation system and method may be employed on a downhole modem coupled to one or more sensor. The sensor interrogation method may continuously, or at intervals, perform dynamic mapping of sensor data with limited space allocated to the storage of the sensor data within memory of the modem. Upon receiving a command from the surface, the data queried is available and ready for compression. The combination of the compression system and methodology and the sensor interrogation system and methodology may increase bandwidth usage and efficient real-time reconstruction of sensor curve data at the surface.

Referring now to FIG. 1, shown therein is a schematic view of a well 10, such as an oil and gas production well, testing well, or other well 10. Once the well 10 has been drilled to form a borehole, the drilling apparatus is removed from the well 10 and test may be performed to determine properties of a formation through which the well 10 has been drilled. In the example of FIG. 1, the well 10 has been drilled and lined with a steel casing 12 (cased hole) in a conventional manner. However, it should be understood that similar systems may be used in unlined (open hole) environments. In order to test the formation, one or more testing apparatus may be placed in the well 10 close to one or more regions to be tested, in this case the formation. Placing the one or more testing apparatus proximate to one of the regions to be tested enables isolation of sections or intervals of the well 10, and enables conveyance of fluids from regions of interest to a surface; certain of the regions of interest may be the region to be tested. Conveying fluids to the surface may be performed using an elastic media 14, such as a drill pipe 16. The drill pipe 16 may be a jointed tubular drill pipe extending from well head equipment 18 at the surface (or sea bed in subsea environments) down inside the well 10 to a zone of interest, which may coincide with the formation or one of the regions of interest. Although the elastic media 14 will be described herein with respect to the drill pipe 16, it should be understood that the elastic media 14 may take other forms, such as production tubing, a drill string, a tubular casing, or the like. The well head equipment 18 may include blow-out preventers and connections for fluid, power, and data communication.

A packer 20 may be positioned on the drill pipe 16 and may be actuated to seal the borehole around the drill pipe 16 at one of the regions of interest. Various pieces of downhole equipment 22 for testing and the like may be connected to the drill pipe 16 at varying locations, above or below the packer 20, such as a sampler 24 or a tester valve 26. The downhole equipment 22 may also be referred to herein as a "downhole tool." Other examples of downhole equipment 22 may include: further packers, circulation valves, downhole chokes, firing heads, TCP (tubing conveyed perforator) gun drop subs, pressure gauges, downhole flow meters, downhole fluid analyzers, etc.

As shown in FIG. 1, the sampler 24 and the tester valve 26 may be located above the packer 20. In order to support signal transmission along the drill pipe 16 between a downhole location and the surface, a series of modems 28 may be positioned along the drill pipe 16 and mounted to the drill pipe 16 via any suitable method, such as clamps 30 or gauge carriers to form a telemetry system 32. As shown in FIG. 1, the telemetry system is provided with a first modem 28-1, a second modem 28-2, a third modem 28-3, and a fourth modem 28-4 connected to the drill pipe. In some embodiments, the series of modems 28 may be connected to the drill pipe 16 via clamps 30 such as a first clamp 30-1, a second clamp 30-2, a third clamp 30-3, and a fourth clamp 30-4, respectively. In some embodiments, certain of the series of modems 28 may be connected to the drill pipe 16 via clamps 30 and certain of the series of modems 28 may be connected to the drill pipe 16 via gauge carriers. For example, the fourth modem 28-4 representing the modem furthest downhole of the series of modems 28 may be connected to the drill pipe via a gauge carrier, while the first, second, and third modems 28-1, 28-2, and 28-3, respectively, are connected to the drill pipe 16 via clamps 30. The downhole equipment 22 is shown to be connected to the fourth modem 28-4 positioned between the sampler 24 and the tester valve 26. However, it should be understood that downhole equipment 22 may be connected to one or more of the series of modems 28. The series of modems 28 may be of varying types and may be configured to communicate with each other via at least one communication channel 34 using one or more protocols. For example. The series of modems 28 may be wireless modems such as acoustic modems. Acoustic modems may be implemented as electro-mechanical devices adapted to convert one type of energy or physical attribute to another, and may also transmit and receive at least one type of energy, thereby allowing electrical signals received from the downhole equipment 22 to be converted into acoustic signals for transmission to the surface, or for transmission to other locations of the drill pipe 16. In some embodiments, the series of modems 28 may be wired modems communicating through a wired network connection extending between the series of modems 28. In some embodiments, the series of modems 28 may be wireless modems which do not operate as acoustic modems.

Where implemented as acoustic modems, the series of modems 28 may be configured to transmit data between one or more of the series of modems 28 along an acoustic wireless network including the at least one communication channel 34. In this embodiment, the series of modems 28 may transmit signals along the drill pipe 16 by creating vibrations within the drill pipe 16. The signals radiating from a transmitting modem of the series of modems 28 may emanate omnidirectionally from the transmitting modem along the drill pipe 16 to be received by a receiving modem of the series of modems 28 for which the signal was intended or as a next hop toward a destination modem of the series of modems 28. In this example, the at least one communication channel 34 is formed along the drill pipe 16, although it should be understood that the communication channel 34 may take other forms, such as production tubing and/or casing. In addition, the series of modems 28, implemented as acoustic modems, may operate to convert acoustic tool control signals from the surface into electrical signals for operating the downhole equipment 22, as well as transmitting to and receiving signals from the downhole equipment 22.

As shown, the first modem 28-1 is provided as a surface modem and may be provided as part of the well head equipment 18 or separate therefrom. The first modem 28-1 may be coupled via a connection 36 to a control system 38. The connection 36 may be a wired connection, such as a data cable, or wireless connection. The well head equipment 18, in some embodiments, may provide a connection between the drill pipe 16 and the connection 36. The control system 38 may be configured to receive data from and transmit signals to the downhole equipment 22, via the telemetry system 32, for example to provide signals for control and operation of the downhole equipment 22. In some embodiments, the control system 38 may be implemented as a computer system and the wireless connection 36 as a WiFi or other wireless network through which the computer system may receive information. In this embodiment, the control system 38 may be provided with a processor (not shown), a non-transitory processor readable medium (not shown), an input (not shown), an output (not shown), and a communications device (not shown). As such, the control system 38 may be implemented as any suitable computer system such as a desktop computer, a laptop, a tablet, a smart phone, a portable digital assistant, a server, a distributed computing system, a server network, a cloud computing system, or any other suitable computer system.

In some embodiments, the telemetry system 32 may be used to provide communication between the control system 38 and one or more of the series of modems 28 and/or downhole equipment 22 coupled to one or more of the series of modems 28. In some embodiments, acoustic telemetry may be used for communication between the downhole equipment 22 in multi-zone testing. In this case, two or more zones of the well 10 are isolated by means of one or more packers 20. Certain of the downhole equipment 22 used for testing is located in each isolated zone and coupled to one or more of the series of modems 28 corresponding with the isolated zone in which the downhole equipment 22 is located. Operation of the series of modems 28 allows the downhole equipment 22 in each zone to communicate with each other as well as the downhole equipment 22 in other zones. The series of modems 28 may also allow communication from the control system 38 with control data and signals in the manner described above, which will be described in more detail below.

In general, in some embodiments where the series of modems 28 are acoustic modems, acoustic signals generated by the series of modems 28 may pass along the drill pipe 16 as longitudinal and/or flexural waves. Each wave may optionally include information indicative of data received from one or more sensor, such as the downhole equipment 22, information indicative of a request for sensor data from the downhole equipment 22, control signals, and other information. The information within the waves may be compressed using encoding schemes, as discussed in more detail below. The waves may further be modulated such that the acoustic signal may have a frequency in the range between about 100 Hz-1 MHz and may be configured to pass data at a rate of between about 1 bps and about 10 kbps. Data rates may be dependent on conditions such as noise levels, carrier frequencies, acoustic channel properties, distances between any two of the series of modems 28, and other factors.

In some embodiments, certain of the series of modems 28 may be configured as repeaters, for example the first, second, and third modems 28-1, 28-2, and 28-3. The data and/or control signals may be transmitted from the control system 38 initially to the first modem 28-1 acting as a surface modem to be repeated and thereby transmitted to the second and third modems 28-2 and 28-3 as acoustic signals. Similarly, data may be transmitted by the fourth modem 28-4 via the first, second, and third modems 28-1, 28-2, and 28-3 to the control system 38 in response to data requests, for example. As repeater modems, the first, second, and third modems 28-1, 28-2, and 28-3 are capable of receiving an acoustic signal generated in the drill pipe 16 by a preceding modem and to amplify and retransmit the signal for further propagation along the drill pipe 16, or to the control system 38 via the connection 36. The number and spacing of the series of modems 28 may depend on the particular installation selected, for example, or the distance that a signal travels. Spacing between the series of modems 28 may be around 1,000 ft (about 304 m), but may be much more or much less in order to accommodate a variety of testing tool configurations.

In some embodiments, the role of the repeater modem, for example the first, second, and third modems 28-1, 28-2, and 28-3, may be to detect an incoming signal, decode the signal, interpret the signal, and subsequently rebroadcast the signal. In some implementations the repeater modem may not decode the signal, but merely amplify the signal (and the noise) and retransmit the signal. In this case, the first, second, and third modems 28-1, 28-2, and 28-3 may act as simple signal boosters. In some embodiments, the repeater modems may listen continuously for any incoming signal, while in other embodiments, the repeater modems may listen intermittently.

Acoustic wireless signals, conveying commands or messages, may propagate in the transmission medium (the drill pipe 16, fluid within the well 10, or the like) in an omnidirectional fashion. The series of modems 28 may not know whether the acoustic signal is coming from another of the series of modems 28 above or below within the telemetry system 32. Each message may contain one or more network address, for example an address of a modem which initially transmitted the message, an address of a modem which last transmitted the message, an address of a modem which is the next hop in the communications channel 34, and/or an address of a destination modem which is the intended recipient of the message, for example the fourth modem 28-4 connected to the downhole equipment 22. Based on the one or more network address embedded in the message, the repeater modems may interpret the message and construct a new message with updated information with regards to the one or more network address, for example by changing the address of the next hop modem in the communication channel 34 and/or the destination address. Messages being sent from the surface may be transmitted from the first modem, 28-1, to the second modem 28-2, to the third modem 28-3, and to the fourth modem 28-4, and at least partially modified along the way to include new network addresses.

Figure 2:
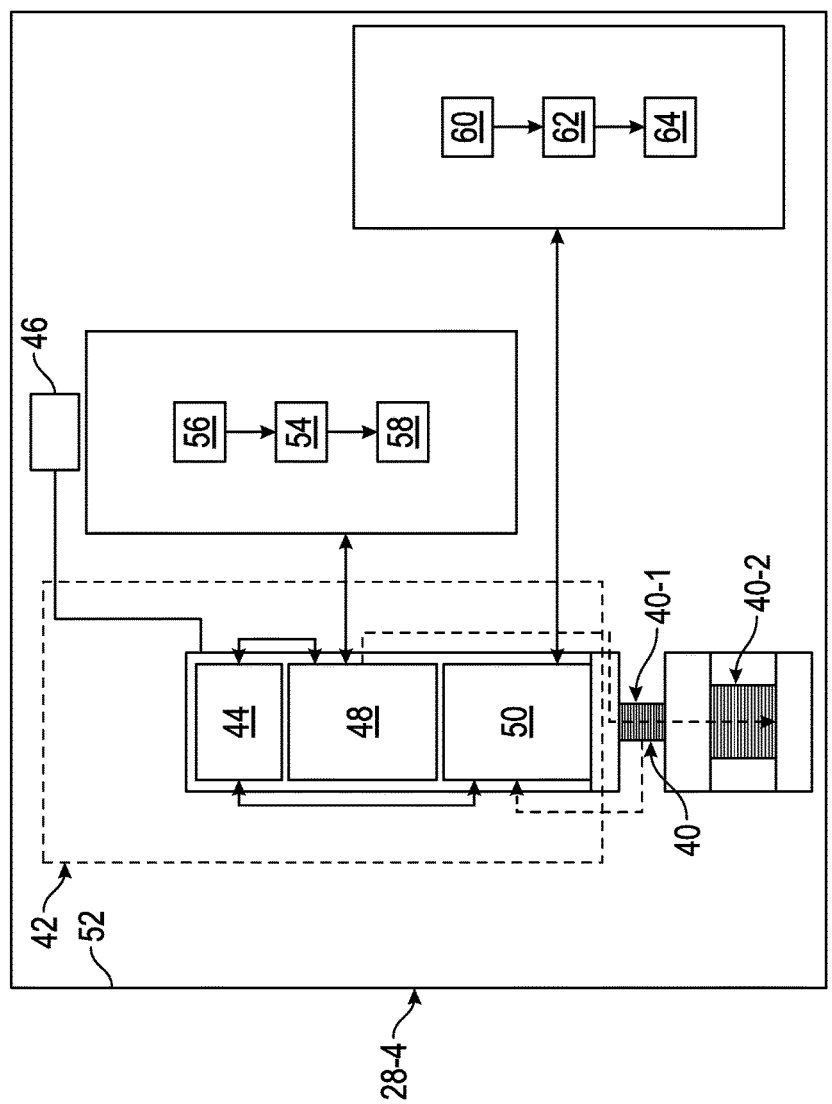
FIG. 2 shows a partial block diagram of a modem constructed in accordance with the present disclosure.

Referring now to FIG. 2, therein shown is a partial schematic drawing of some embodiments of one of the series of modems 28. For clarity, the series of modems 28 will be described in reference to a single modem, in this case the fourth modem 28-4. The fourth modem 28-4 may include a transceiver assembly 40, transceiver electronics 42 coupled to the transceiver assembly 40, a non-transitory processor readable medium 44 coupled to the transceiver electronics 42, and a power supply 46 supplying power to the transceiver assembly 40, transceiver electronics 42, and the non-transitory processor readable medium 44. As shown in FIG. 2, the fourth modem 28-4 may be provided with multiple transceiver assemblies 40-1 and 40-2. The transceiver electronics 42 may include transmitter electronics 48 and receiver electronics 50 configured to perform the functions of the transceiver electronics 42, which will be described in more detail below. The transceiver assembly 40, the transceiver electronics 42, the non-transitory processor readable medium 44, and the power supply 46 may be located in a single housing 52. The series of modems 28 may be of similar construction and function except as described below. For example, certain of the series of modems 28 may be coupled to one or more sensor to receive one or more sensor data stored as data samples on the non-transitory processor readable medium 44, as will be discussed in more detail below.

The transceiver assembly 40 may be a wired transceiver assembly or a wireless transceiver assembly. For example, in some embodiments the transceiver assembly 40 may be an acoustic wireless transceiver assembly. In this embodiment, the transceiver assembly 40 may convert electrical signals to acoustic signals and vice-versa. The transceiver assembly 40 may thereby generate acoustic signals in the material of the drill pipe 16 to transmit data to another of the series of modems 28. However, it should be understood that the transceiver assembly 40 may be embodied as other forms including an electromagnetic transceiver assembly; a pressure-type transceiver assembly using technologies such as mud-pulse telemetry, pressure-pulse telemetry, or the like; or a wired transceiver assembly transmitting and receiving signals via a wired connection traveling between the series of modems 28. The transceiver assembly 40 will be described herein by way of example as an acoustic type of transceiver assembly, however, it should be understood that the transceiver assembly 40 may be implemented in other ways, while performing the same or similar functions.

The transceiver electronics 42, as described above, may include the transmitter electronics 48 and the receiver electronics 50. In general, the transceiver electronics 42 may be adapted to vary parameters of wired or wireless signals transmitted into the communication channel 34 by the transceiver assembly 40. For example, the transceiver electronics 42 may vary the frequency, bit rate, timing, amplitude, and the like of the signals being sent into the communication channel 34. Two or more variable parameters of the signal generally define a transmission pair for the signal.

The transmitter electronics 48 may be implemented with a processing unit 54 configured to perform functions related to preparing signals for transmission by the transceiver assembly 40. In some embodiments, the transmitter electronics 48 may include an amplifier 56, such as a linear amplifier or a non-linear amplifier, to amplify a signal prepared by the processing unit 54. The fourth modem 28-4 may be coupled to one or more sensor 58 such that the transmitter electronics 48 may initially receive an output signal from the one or more sensor 58, for example from the downhole equipment 22 provided from an electrical or electro/mechanical interface. Such signals may be digital signals which may be provided to the one or more processing unit 54. The processing unit 54 may modulate the signal in one of a number of known ways, such as FM, PSK, QPSK, QAM, and the like. The resulting modulated signal may then be amplified by the amplifier 56 and transmitted to the transceiver assembly 40. In some embodiments, transmitting the modulated signal to the transceiver assembly 40 generates a wireless, e.g., acoustic, signal in the material of the drill pipe 16.

The receiver electronics 50 may be configured to receive the signal produced by and transmitted by another one of the series of modems 28. The receiver electronics 50 are capable of converting the signal, such as an acoustic signal, into an electrical signal. In some embodiments, an acoustic signal passing along the drill pipe 16 excites the transceiver assembly 40 so as to generate an electrical output signal (voltage) to be received by the receiver electronics 50. However, it is contemplated that the acoustic signal may excite an accelerometer (not shown) or an additional transceiver assembly 40 so as to generate an electrical output signal (voltage). This signal may be an analog signal carrying digital information. In this embodiment, the receiver electronics 50 may be provided with a signal conditioner 60, an A/D (analog-to-digital) converter 62, and a processing unit 64. The analog signal may be applied to the signal conditioner 60, which may operate to filter/condition the analog signal to be digitized by the A/D converter 62. The A/D converter 62 provides a digitalized signal which may be applied to the processing unit 64. The processing unit 64 may be adapted to demodulate the digital signal in order to recover data provided by the one or more sensor 58 connected to another one of the series of modems 28, or provided by the surface. The type of signal processing depends on the applied modulation (i.e. FM, PSK, QPSK, QAM, and the like). In some embodiments, data may be provided by any of the series of modems 28 with or without the one or more sensor 58.

The processing units 54 and 64 may be implemented as a single processor or multiple processors working together or independently to execute processor executable instructions, described in more detail below. Embodiments of the processing units 54 and 64 may include one or more microcontrollers, digital signal processors, central processing units, application specific integrated circuits, microprocessors, multi-core processors, or the like. In some embodiments, the processing units 54 and 64 may be contained within one or more computer, network device, manufacturing tool, or the like, or any device with a set of one or more processors, or multiple devices having one or more processors that work together.

The non-transitory processor readable medium 44 may be implemented as RAM, ROM, flash memory, or the like, and may take the form of a magnetic device, optical device, or the like. The non-transitory processor readable medium 44 may be a single non-transitory processor readable medium or multiple non-transitory processor readable media functioning logically together or independently. The non-transitory processor readable medium 44 may be coupled to and configured to communicate the transceiver electronics 42, or the processing units 54 and 64 within the transceiver electronics 42, via one or more path such as a data bus, for example. The non-transitory processor readable medium 44 may store processor executable instructions, as will be described below in more detail, and may also store data structures, such as a database, for example. The data structures on the non-transitory processor readable medium 44 may store data such as sensor data from the one or more sensor 58 indicative of one or more measurement of a downhole environment, or a parameter within the downhole environment, to which the one or more sensor 58 may be exposed.

The power supply 46 may be configured to supply power to the transceiver assembly 40; the transceiver electronics 42, including the transmitter electronics 48 and the receiver electronics 50; and the non-transitory processor readable medium 44. The power supply 46 may be implemented as one or more battery, such as a lithium battery, for example. It should be understood that the power supply 46 may be implemented as any suitable battery capable of powering the transceiver assembly 40, the transceiver electronics 42, and the non-transitory processor readable medium 44.

Figure 3:
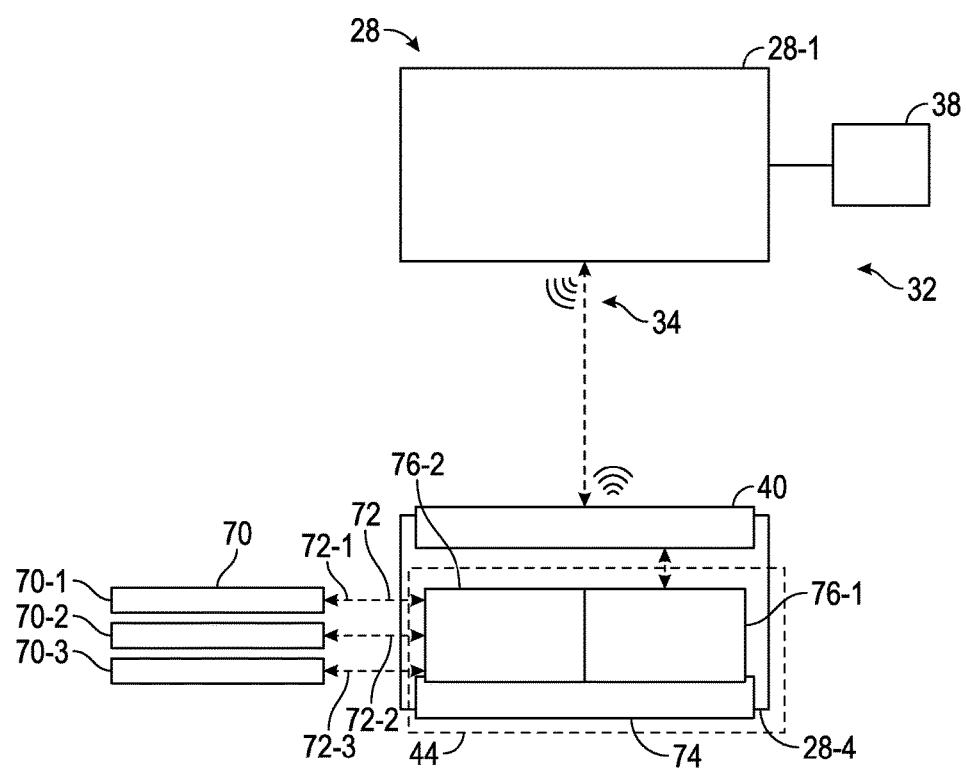
FIG. 3 shows a partial schematic view of the downhole telemetry system of FIG. 1.

Referring now to FIG. 3, shown therein is a diagrammatic representation of the telemetry system 32, showing the first and fourth modems 28-1 and 28-4 positioned at either end of the communication channel 34 in a downhole environment. The first modem 28-1 may be operably coupled to the control system 38 to transmit/receive information between the control system 38 and the fourth modem 28-4. The first modem 28-1 may communicate with the fourth modem 28-4 via the communications channel 34, for example through acoustic vibrations across the drill pipe 16. The fourth modem 28-4 may be operably coupled to one or more sensor 70 via a communication path 72. As shown the fourth modem 28-4 is connected to a first sensor 70-1, a second sensor 70-2, and a third sensor 70-3 via a first communication path 72-1, a second communication path 72-2, and a third communication path 72-3, respectively. The first, second, and third sensors 70-1, 70-2, and 70-3 may be implemented similarly to the sensor 58, as the downhole equipment 22. The first, second, and third communication path 72-1, 72-2, and 72-3 may be implemented as a data bus, a wired connection, or a wireless connection, for example. As shown, the non-transitory processor readable medium 44 may store a buffer 74 and processor executable instructions 76. As will be explained below in more detail, the fourth modem 28-4 may interrogate the one or more sensor 70 for data, such as one or more measurement of the downhole environment, for example. The processing unit 54 or the processing unit 64 may store the data received from the one or more sensor 70 in the buffer 74. The fourth modem 28-4 may communicate with the first modem 28-1 via the transceiver assembly 40 transmitting and receiving at least a portion of the data stored in the buffer 74 which may be encoded for transmission, at least in part.

The processor executable instructions 76 may be configured to be read and/or to be executed by the processing unit 54 and/or 64. The processor executable instructions 76 may include a sensor interrogation program 76-1, a compression program 76-2, and other processor executable instructions 76-3, such as firmware, an operating system, encoding instructions, and decoding instructions, for example. The processor executable instructions 76 may be written in any suitable programming language, such as C++, C#, Java, Python, Basic, or any other high-level or low-level programming languages, for example.

Figure 4:
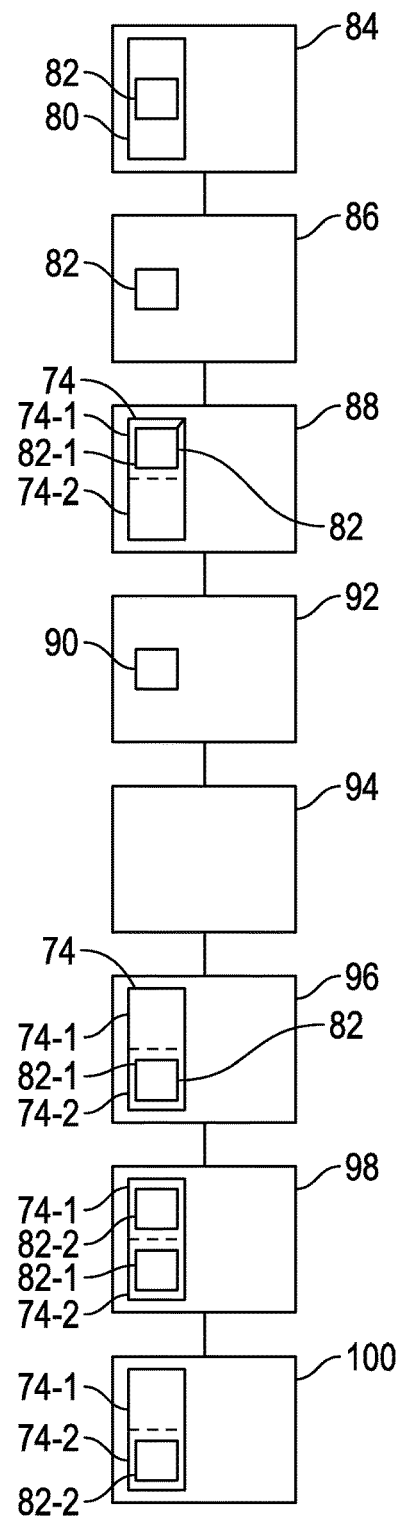
FIG. 4 shows a diagrammatic representation of a method of sensor interrogation performed by a downhole modem in accordance with the present disclosure.

Referring now to FIG. 4, shown therein is a diagrammatic representation of one embodiment of the sensor interrogation program 76-1 stored in the non-transitory processor readable medium 44. In use, the processing unit 54, executing the processor executable instructions for the sensor interrogation program 76-1, may perform a first set of one or more queries 80 on the one or more sensor 70 for one or more data 82 collected by the one or more sensor 70, as indicated by block 84. The one or more data 82 may be data samples indicative of one or more measurement from one or more sensor 70. The processing unit 54 may then receive the one or more data 82 from the one or more sensor 70 in response to the one or more queries 80, as indicated by block 88. The processing unit 54 may receive a command 90 from the first modem 28-1, indicative of a request for the one or more data 82 from the fourth modem 28-4, as indicated by block 92. The command 90 may be transmitted via the first modem 28-1 from the control system 38, and may be initiated by a user or be performed automatically based on one or more of a plurality of parameters, such as a predetermined period of time, an event, or the like.

As shown in FIG. 4, in some embodiments, the buffer 74 may be divided into a first buffer portion 74-1 and a second buffer portion 74-2. The buffer 74 may be a fixed size buffer and the first and second buffer portions 74-1 and 74-2 may be mobile within the fixed size buffer 74. Boundaries of the first and second buffer portions 74-1 and 74-2 may change as sensor interrogation proceeds. The first buffer portion 74-1 may be configured to store at least a portion of the one or more data 82 when received from the one or more sensor 70. The second buffer portion 74-2 may be configured to store at least a portion of the one or more data 82 which has been transmitted to the first modem 28-1 in response to a command 90, but which may or may not yet have been received by the first modem 28-1. For example, the first and second buffer portions 74-1 and 74-2 may store a portion of the one or more data 82 along with a timestamp of a first sample of the one or more data 82 stored within the respective buffer portion, a time-span between samples stored within the respective buffer, and an index of the next sample to be stored within the respective buffer.

When the processing unit 54 receives a first data 82-1 of the one or more data 82, the processing unit 54 may store the first data 82-1 in the first buffer portion 74-1, as indicated in block 88. The first data 82-1 may be indicative of one of the one or more queries 80. The one or more queries 80 may be performed in an initial predetermined rate until the first buffer portion 74-1 is full, as will be explained below in more detail. Once full, if the second buffer portion 74-2 is empty and if the processing unit 54 has not yet received the command 90, the processing unit 54 may decimate the first data 82-1 stored in the first buffer portion 74-1, as will be explained more fully below. After decimation, the processing unit 54 may continue the one or more queries 80 at a rate having a time period in between queries larger than an initial time period between queries. For example, the time period in between queries after decimation may be twice that of the initial predetermined rate.

Upon receiving the command 90, the processing unit 54 may cause the transceiver assembly 40 to transmit the first data 82-1 to the first modem 28-1, as indicated by block 94. The processing unit 54 may perform an encoding operation, discussed below in more detail, prior to causing the transceiver assembly 40 to transmit the first data 82-1. The processing unit 54 may then transfer the first data 82-1 to the second buffer portion 74-2, as indicated by block 96. For example, in some embodiments, the position of the first data 82-1 in the buffer 74 may not change. In this embodiment, the boundaries of the first buffer portion 74-1 and the second buffer portion 74-2 may change such that the second buffer portion 74-2 contains the first data 82-1 and the first buffer portion 74-1 is indicated as empty and ready to receive new data sample. In some embodiments, after the boundary change, data found in the new boundary of the first buffer 74-1 may be marked or otherwise indicated as free space within the buffer 74 suitable to be overwritten with subsequent data. The boundaries of the first buffer portion 74-1 and second buffer portion 74-2 may be implemented using pointers and/or addresses within the buffer 74. The first data 82-1, having been subject to the command 90 and transmitted to the first modem 28-1 may be stored in the second buffer portion 74-2 until the processing unit 54 has received confirmation that the first modem 28-1 received the first data 82-1.

The processing unit 54 may then receive a second data 82-2 of the one or more data 82, in response to a second set of queries of the one or more queries 80, and store the second data 82-2 in the first buffer portion 74-1, as indicated by block 98. In some embodiments, the processing unit 54 may perform the second set of queries of the one or more queries 80 at the initial predetermined rate. As before, once the first buffer portion 74-1 is full of the second data 82-2, the processing unit 54 may perform a decimation of the data stored on either the first buffer portion 74-1 or the buffer 74, as will be described in more detail below. The processing unit 54 may overwrite data stored in the first buffer portion 74-1 after receiving subsequent data, or may erase and/or mark for deletion data stored in the first buffer portion 74-1 after transmitting the data stored in the first buffer portion 74-1 and transferring a copy of the data to the second buffer portion 74-2. As previously noted, in some embodiments, the processing unit 54 may change the boundaries of the first and second buffer portions 74-1 and 74-2 instead of transferring a copy of the data to the second buffer portion 74-2. When the processing unit 54 receives confirmation that the first data 82-1 has been received by the first modem 28-1, and receives a second command of the one or more command 90 for the second data 82-2, the processing unit 54 may remove, overwrite, and/or mark for deletion the first data 82-1 and store a copy of the second data 82-2 in the second buffer portion 74-2, as indicated by block 100. The processing unit 54 may also change the boundaries of the first and second buffer portion 74-1 and 74-2 such that the second buffer portion 74-2 contains the second data 82-2 and the first buffer portion 74-1 is indicated as empty. The processing unit 54 may continue to query the one or more sensor 70, receive portions of the one or more data 82, transmit portions of the one or more data 82 upon receipt of the one or more command 90, and transfer portions of the one or more data 82 from the first buffer portion 74-1 to the second buffer portion 74-2 for a period of time, based on a set of parameters, user interaction, or other suitable factors in the same manner as previously described. After each subsequent command of the one or more command 90, the processing unit 54 may reinitiate the one or more queries at the initial predetermined rate.

The processing unit 54 may perform the queries 80 at the predetermined rate at predetermined instants of time prior to receiving the command 90 from the first modem 28-1. For example, the processing unit 54 may perform an initial set of the one or more queries 80 at predetermined instants of time when filling the first buffer portion 74-1 with sensor data before the buffer 74 is full. In some embodiments, when the buffer 74 or the first buffer portion 74-1 is full, the data stored on the buffer 74 or the first buffer portion 74-1 may be decimated and the queries 80 performed at a rate half as large as the initial predetermined rate, i.e., the time periods between queries is twice as large as the initial time periods between queries. The predetermined instants of time for performing the initial set of the one or more queries 80, the first set or the second set described above, may be spaced apart by a predetermined constant time interval. By way of illustration, the initial set of the one or more queries 80 may be performed at a rate of a query 80 conducted at four second intervals. Once the buffer 74 or the first buffer portion 74-1 is full and the data stored therein is decimated, the one or more queries 80 may be performed at a rate of a query 80 conducted at eight second intervals. In some embodiments, the instants of time, predetermined or otherwise, may be divided based on one or more parameter, such as a size of the buffer 74, a size of the first buffer portion 74-1, the amount of data stored in the buffer 74 or the first buffer portion 74-1, or a time span represented in the first buffer portion 74-1 versus the second buffer portion 74-2, for example. In one embodiment, the processing unit 54 may perform the one or more queries 80 in such a way that, at any time, the first buffer portion 74-1 contains as much of the one or more data 82 as is possible, from a time when a last portion of the one or more data 82 was sent to the surface to a present time, so long as the time span represented by the one or more data 82 in the first buffer portion 74-1 does not exceed the time span represented by the one or more data 82 in the second buffer portion 74-2, as will be explained in more detail below. The one or more data 82, in this embodiment, may be discrete sensor data points stored in the first buffer portion 74-1 in a predetermined data format such as a database, a relational database, or a temporal database, for example.

Decimation of the data 82 may be performed by downsampling the rate of the one or more queries 80, as previously discussed, by two and/or downsampling the data 82 by two. In either event, decimation includes the processing unit 54 updating the properties of the first and/or second buffer portions 74-1 and 74-2. For example, after decimation, as noted above, the one or more queries 80 may be performed at a rate of one query per eight seconds. Where decimation is performed on the data 82 stored in the buffer 74, the data 82 may be downsampled by two thereby deleting and/or marking as usable space previously occupied by half of the data 82, representing alternating samples of the data 82. In this manner, the data 82 stored in the buffer 74 represents the same rate of sampling as the one or more queries 80 after decimation.

Decimation of the data 82 may be performed based on one or more of a plurality of elements. For example, in some embodiments, when the first buffer portion 74-1 is full, the processing unit may determine whether the second buffer portion 74-2 is empty. If the second buffer portion 74-2 is empty, the processing unit 54 may decimate the data stored in the first buffer portion 74-1. When the second buffer portion 74-2 is not empty, the processing unit 54 may determine whether the data stored in the first buffer portion 74-1 represents a time span that is less than the time span of the data stored in the second buffer portion 74-2. Where the time span of the data in the first buffer portion 74-1 is less than that in the second buffer portion 74-2, the processing unit 54 may decimate the data in the first buffer portion 74-1. Where the time span of the data in the first buffer portion 74-1 is not less than that in the second buffer portion 74-2, the processing unit 54 may decimate the data stored in the buffer 74, i.e., the data stored in each of the first and second buffer portions 74-1 and 74-2.

In some embodiments, when a command 90 arrives downhole, the processing unit 54 may determine whether a message containing the first data 82-1 was received by the first modem 28-1 in response to the command 90. At this time, the first data 82-1 (already sent) is in the second buffer portion 74-2 and the buffer 74 may or may not be full. If the first data 82-1 was received by the first modem 28-1, the second buffer portion 74-2 is emptied. If the first data 82-1 was not received by the first modem 28-1, the first buffer portion 74-1 and the second buffer portion 74-2 are merged. In this event, the processing unit 54 may determine whether the time span of the data contained in the first buffer portion 74-1 is less than the time span of the data contained in the second buffer portion 74-2. Where the time span of the data contained in the first buffer portion 74-1 is less than that contained in the second buffer portion 74-2, the processing unit 54 may decimate the data stored in the first buffer portion 74-1 until the time spans of the data stored in the first buffer portion 74-1 and the second buffer portion 74-2 are equal. Where the time span of the data in the first buffer portion 74-1 is equal to that in the second buffer portion 74-2, the data from the first buffer portion 74-1 is transferred into the second buffer portion 74-2 to be stored along with the data previously contained in the second buffer portion 74-2. The processing unit 54 may, in effect, transfer the data from the first buffer portion 74-1 to the second buffer portion 74-2 to be stored along with the data previously contained in the second buffer portion 74-2 by changing the boundaries of the first buffer portion 74-1 and the second buffer portion 74-2.

As will be explained below in more detail, prior to or after decimation, the data stored in the second buffer portion 74-2 may be encoded to fit within a predetermined communication size or bit budget. In some embodiments, if the data stored in the second buffer portion 74-2 may not be encoded or otherwise compressed into the predetermined communication size, the processing unit 54 may decimate the data stored in the second buffer portion 74-2 one or more times in order to enable an encoding scheme to transmit the data in the predetermined communication size.

In some embodiments, when the first buffer portion 74-1 has been emptied and the second buffer portion 74-2 has data amounting to greater than half the total size of the buffer 74, the processing unit 54 may decimate the data stored in the second buffer portion 74-2 such that the first buffer portion 74-1 has at least half of the space of the buffer 74 for the samples that the first buffer portion 74-1 is going to receive.

After the processing unit has transmitted the first data 82-1, or any other portion of the one or more data 82, the processing unit 54 may resume the one or more queries 80 at the initial predetermined rate, for example a query 80 conducted at four second intervals to receive portions of the one or more data 82 and store the portions in the first buffer portion 74-1.

It should be noted, that the decimation process of the processing unit 54 may be independent of the one or more command 90. The decimation process may be performed without regard to receipt of the one or more command 90 and without regard to the rate at which the one or more commands 90 are received. The processing unit 54 may calculate the time of the next one or more queries 80, store the corresponding portions of the one or more data 82 in the first buffer portion 71-4, and decimate either the first buffer portion 74-1 or the buffer 74, independently of the one or more command 90.

As noted above, the buffer 74 can be a fixed size. The size of the buffer 74 may be based in part on an expected round-trip time for a message sent using the communications channel 34 between the first modem 28-1 and the fourth modem 28-4 and a minimal modem-to-sensor query interval. By way of further example, if command 90 is expected to arrive downhole at four minute intervals (round trip time), and if the one or more queries 80 are to be performed each four seconds, making sixty data points in four minutes, the buffer 74 may be sized to enable storage of at least 120 data points as well as a time reference for each point in the first and second portions 74-1 and 74-2 (e.g. a time of a first point and a time span for each of the first and second portions 74-1 and 74-2). When the buffer 74, the first buffer portion 74-1, and/or the second buffer portion 74-2 is full, the processing unit 54 may perform a buffer decimation, discussed in greater detail below, to continue to perform the one or more queries 80 on the one or more sensor 70 with the size of the first buffer portion 74-1 and/or the second buffer portion 74-2 effectively half that of the original size prior to decimation. For example, either the buffer 74 or the first buffer portion 74-1 may be decimated, depending on the time spans between points in the first buffer portion 74-1 and the second buffer portion 74-2. Requests from the first modem 28-1, for the one or more data 82, may include whether a previous request was satisfied, a precision parameter for a determination of a desired precision of the one or more data 82, and other information related to the transmission of the one or more data 82 stored in the buffer 74.

Figure 5:
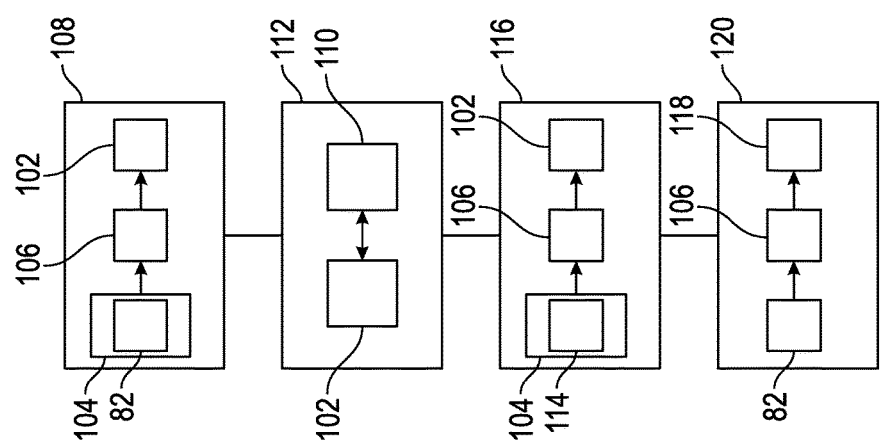
FIG. 5 shows a diagrammatic representation of an encoding and compression scheme performed by a downhole modem in accordance with the present disclosure.

Referring now to FIG. 5, shown therein is a diagrammatic representation of one embodiment of the compression program 76-2 stored in the non-transitory processor readable medium 44. In use, the processing unit 54 may calculate a size 102 of an output bit stream 104 based on an encoding scheme 106 for transmission of the data 82 stored in the buffer 74, as indicated by block 108. The processing unit 54 may decimate the data 82 stored in the buffer 74 if the size 102 of the output bit stream 104 exceeds a predetermined size 110, as indicated by block 112. The processing unit 54 may then recalculate the size 102 of the output bit stream 104, after decimation of the data 82 stored in the buffer 74, based on the encoding scheme 106 to encode for transmission a decimated data 114, formed from decimating the data 82, as indicated by block 116. In some embodiments, the processing unit 54 may then encode the data 82 or the decimated data 114 using the encoding scheme 106, as indicated by block 116. Encoding the data 82 or the decimated data 114 may generate a message 118 for transmission to the first modem 28-1 and thereby the control system 38, as indicated by block 120.

The encoding scheme 106 may be stored in the non-transitory processor readable medium 44. The encoding scheme 106 may be any encoding scheme capable of encoding data into an electrical, analog, wired, wireless, and/or acoustic signal for transmission between the series of modems 28 in the downhole environment. The encoding scheme 106 may compress the data 82 or the decimated data 114 into a lossless or near-lossless encoded signal, the message 118, such that a distortion is constrained. The distortion, in this case, is a difference between the data 82 or the decimated data 114 and the data decoded from the encoded signal. The distortion may be a fixed distortion or be at or below a predetermined allowable error. The encoding scheme 106 may have a compression rate, for compressing the data 82 or the decimated data 114, which may depend on the data 82 or the decimated data 114, whichever is being compressed, since by nature the performance of a lossless or near-lossless encoding scheme depends on the statistics/distribution of the data 82 or the decimated data 114.

The encoding scheme 106 may not encode the data 82 for calculating the size 102 of the output bit stream 104. Instead, the encoding scheme 106 may be provided with a test function, associated with the encoding scheme, to indicate a number of bits the encoding scheme 106 would take to encode an error signal with the encoding scheme 106 or a number of points, of the error signal that the encoding scheme 106 may fit into a bit-budget. The error signal may be a value indicative of the data 82 or the decimated data 114 when the compression algorithm is applied.

Figure 6:
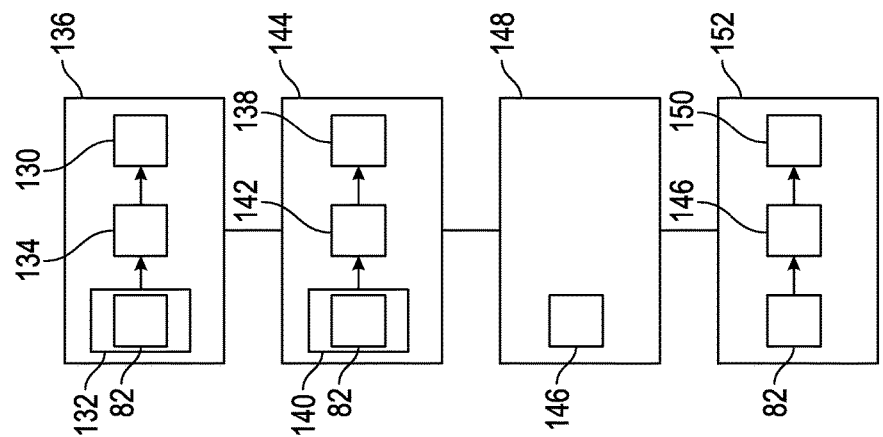
FIG. 6 shows a diagrammatic representation of an encoding and compression scheme performed by a downhole modem in accordance with some embodiments of the present disclosure.

Referring now to FIG. 6, shown therein is a diagrammatic representation of another embodiment of the compression program 76-2 stored in the non-transitory processor readable medium 44. In use, the processing unit 54 may calculate a first size 130 of a first output bit stream 132 based on a first encoding scheme 134 to encode for transmission the data 82, as indicated by block 136. The processing unit 54 may then calculate a second size 138 of a second output bit stream 140 based on a second encoding scheme 142 to encode for transmission the data 82, as indicated by block 144. The processing unit 54 may then select a selected encoding scheme 146 based on the relative sizes, the first size 130 and the second size 138, of the first output bit stream 132 and the second output bit stream 140, as indicated by block 148. The selected encoding scheme 146 may be either the first encoding scheme 134 or the second encoding scheme 142. The processing unit 54 may then encode the data 82 stored in the buffer 74 using the selected encoding scheme 146 to produce a message 150 for transmission to the first modem 28-1, as indicated by block 152. In some embodiments, the first encoding scheme 134 and the second encoding scheme 142 may be members of a group of n encoding schemes where n>two. As such, the processing unit 54 may calculate a plurality of sizes of a plurality of output bit streams based on a plurality of encoding schemes represented by the group of n encoding schemes.

Referring now to FIG. 7, shown therein is a diagrammatic representation of another embodiment of the compression program 76-2, similar to the embodiments shown in FIG. 6. However, prior to selecting an encoding scheme, the processing unit 54 may determine if a smaller bit stream 160 of the first output bit stream 132 and the second output bit stream 140 exceeds a predetermined size, as indicated by block 162. If the smaller bit stream 160 exceeds the predetermined size, the processing unit 54 may decimate the data 82 stored in the buffer 74 to form a decimated data 164, as indicated by block 166. The processing unit 54 may then recalculate the first size 130 and the second size 138 of the first output bit stream 132 and the second output bit stream 140, respectively, for transmitting the decimated data 164 in the buffer 74, as indicated by block 168. The processing unit 54 may determine if the size of a smaller bit stream 170 of the first bit stream 132 and the second bit stream 140, calculated from the decimated data 164, exceeds a predetermined size, as indicated by block 172. The processing unit 54 may then further decimate the decimated data 164 one or more times, to form a second decimated data 174, if the size of a smaller bit stream 170 of the first bit stream 132 and the second bit stream 140 is greater than the predetermined size, as indicated by block 176. In some embodiments, the processing unit 54 may further decimate the decimated data 164 if the size of the first and second output bit streams 132 and 140, after being recalculated based on the decimated data 164, is greater than a predetermined size, without determining which is smaller.

Shown below is a table of multiple decimation levels and calculations of first and second bit streams 132 and 140.

TABLE 1

| Decimation level | Encoding scheme 1 (bits) | Encoding scheme 2 (bits) |
|---|---|---|
| 1 | 300 | 280 |
| 2 | 220 | 90 |
| 3 | 100 | 110 |

In some embodiments, the encoding scheme of a set of n which minimizes the number of bits over a set of a certain number of decimation levels is selected. As shown, the size of the second bit stream 140 at the second decimation level is smaller than the sizes of the first and second bit streams 132 and 140 at the other decimation levels. In this case, encoding scheme 2 at decimation level 2 would be selected since the combination of encoding scheme 2 at the decimation level 2 minimizes the number of bits relative to the possible combinations set forth above. The number of the bits in the second bit stream 140 at decimation level 3 increases over the number of the bits in the second bit stream 140 at decimation level 2. It should be understood that decimating the input data may not decrease the number of bits in the first and second bit streams 132 and 140.

Figure 8:
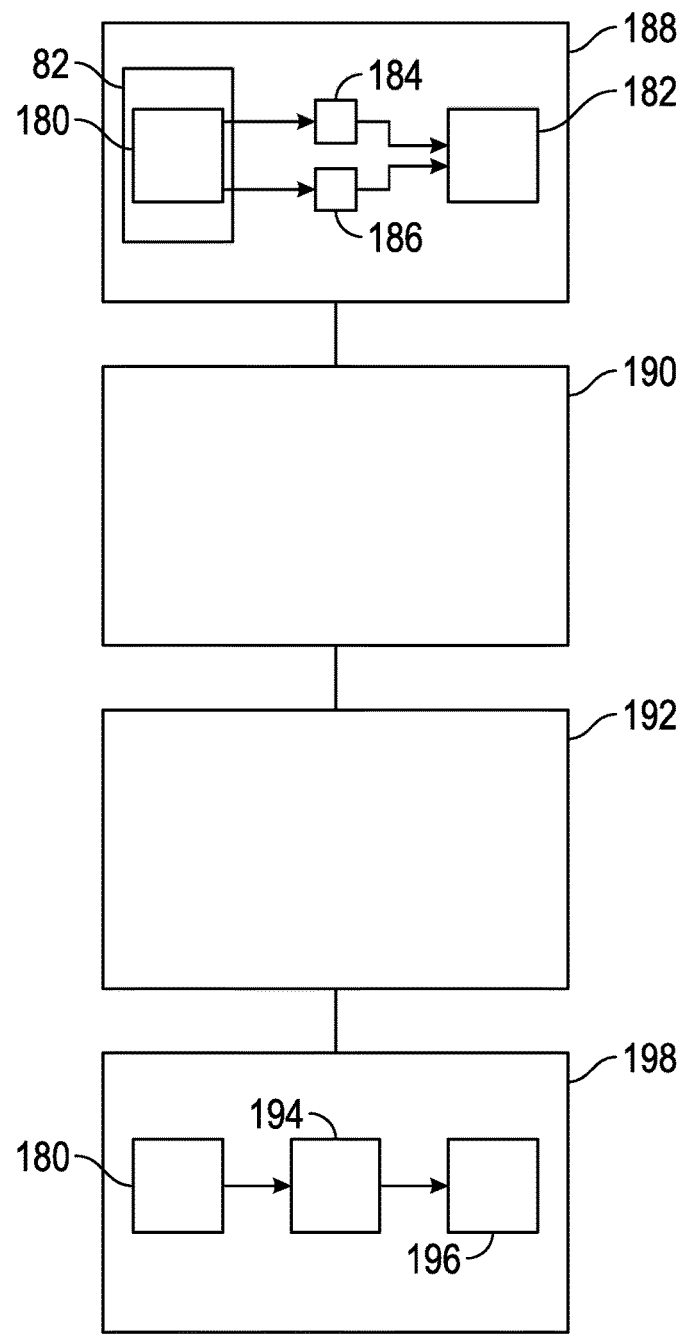
FIG. 8 shows a diagrammatic representation of an encoding and compression scheme performed by a downhole modem in accordance with some embodiments of the present disclosure.

Referring now to FIG. 8, shown therein is a diagrammatic representation of an embodiment of the compression program 76-2 stored in the non-transitory processor readable medium 44. In use, the processing unit 54 may calculate a number of data samples 180, of the data 82 stored in the buffer 74, able to be encoded into a predetermined budget 182 by a first encoding scheme 184 and a second encoding scheme 186, as indicated by block 188. It is generally possible to calculate the number of samples encoded in the predetermined budget 182 when the encoding scheme works "chronologically," i.e., when the values are encoded one after the other from the first one. The data samples may be indicative of one or more measurement of the downhole environment by the one or more downhole sensor 70. The processing unit 54 may then determine which of the first encoding scheme 184 and the second encoding scheme 186 may enable encoding a larger number of the number of data samples 180 within the predetermined budget 182, as indicated by block 190. The processing unit 54 may select the first encoding scheme 184 or the second encoding scheme 186 enabling encoding of the larger number of the number of data samples 180 within the predetermined budget 182, as indicated by block 192. The processing unit 54 may then encode the number of data samples 180 using a selected encoding scheme 184 of the first encoding scheme 184 and the second encoding scheme 186 to generate a message 196 for transmission to the first modem 28-1, as indicated by block 198.

Although the compression program 76-2 has been described herein for purposes of clarity with two encoding schemes 184 and 186, it should be understood that more than two encoding schemes can be used. Further, although some embodiments of the present disclosure have been described in detail above, those of ordinary skill in the art will readily appreciate that many modifications are possible without materially departing from the teachings of the present disclosure. Accordingly, such modifications are intended to be included within the scope of the present disclosure as defined in the claims.

Although the preceding description has been described herein with reference to particular means, materials and embodiments, it is not intended to be limited to the particulars disclosed herein; rather, it extends to functionally equivalent structures, methods, and uses, such as are within the scope of the appended claims.

The invention claimed is:

1. A method for compressing data, comprising:
   calculating, by a processor, a size of an output bit stream based on an encoding scheme to encode for transmission the data stored in a buffer, the data being indicative of one or more measurements of a downhole environment by one or more downhole sensors;
   decimating, by the processor, the data stored in the buffer if the size of the output bit stream exceeds a predetermined size;

recalculating, by the processor, the size of the output bit stream, after the decimation of the data stored in the buffer, based on the encoding scheme to encode for transmission the decimated data stored in the buffer; and encoding, by the processor, the data stored in the buffer using the encoding scheme.

2. The method of claim 1, wherein the buffer and the encoding scheme are stored in a non-transitory processor readable medium of a downhole modem.

3. The method of claim 2, wherein the processor is a component of the downhole modem and wherein the downhole modem is an acoustic modem.

4. The method of claim 1, wherein the output bit stream is a first output bit stream having a first size and the encoding scheme is a first encoding scheme on which the first output bit stream is based, and wherein said encoding is defined further as:
calculating, by the processor, a second size of a second output bit stream based on a second encoding scheme to encode, for transmission, the data stored in the buffer; and
said encoding, by the processor, the data stored in the buffer with the first encoding scheme responsive to the first size being smaller than the second size, or with the second encoding scheme responsive to the second size being smaller than the first size.

5. The method of claim 4, wherein the first encoding scheme, the second encoding scheme, and the buffer are stored in a non-transitory processor readable medium of a downhole modem.

6. The method of claim 5, wherein the downhole modem is an acoustic modem.

7. The method of claim 1, wherein the size of the output bit stream is a size of a first output bit stream, the method further comprising:
recalculating, by the processor, a size of a second output bit stream based on the encoding scheme to encode for transmission the decimated data stored in the buffer.

8. The method of claim 7, wherein the decimated data is further decimated if the size of the second output bit stream is greater than the predetermined size, where the predetermined size is a bit budget.

9. A method for compressing data, comprising:
calculating, by a processor, a first size of a first output bit stream based on a first encoding scheme to encode, for transmission, the data stored in a buffer, the data being indicative of one or more measurements of a downhole environment by one or more downhole sensors;
said calculating, by the processor, a second size of a second output bit stream based on a second encoding scheme to encode, for the transmission, the data stored in the buffer;
selecting, by the processor, a selected encoding scheme based upon relative sizes of the first bit stream and the second bit stream, the selected encoding scheme being either the first encoding scheme or the second encoding scheme; and
encoding, by the processor, the data stored in the buffer using the selected encoding scheme,
wherein said calculating the first size of the first output bit stream based on the first encoding scheme is defined further as said calculating multiple first sizes of the first output bit stream at multiple decimation levels and based on the first encoding scheme, wherein said calculating the second size of the second output bit stream based on the second encoding scheme is defined further as said calculating multiple second sizes of the second output bit stream at the multiple decimation levels and based on the second encoding scheme, and wherein said selecting, by the processor, the selected encoding scheme based upon relative sizes of the first bit stream and the second bit stream is defined further as said selecting the selected encoding scheme and a decimation level based upon the relative sizes of the multiple first sizes and the multiple second sizes.

10. The method of claim 9, where the first encoding scheme and the second encoding scheme are members of a group of n encoding schemes where n >2.

11. The method of claim 9, wherein the first encoding scheme, the second encoding scheme, and the buffer are stored in a non-transitory processor readable medium of a downhole modem.

12. The method of claim 11, wherein the downhole modem is an acoustic modem.

13. A method for compressing data, comprising:
calculating, by a processor, a first size of a first output bit stream based on a first encoding scheme to encode, for transmission, the data stored in a buffer, the data being indicative of one or more measurements of a downhole environment by one or more downhole sensors;
said calculating, by the processor, a second size of a second output bit stream based on a second encoding scheme to encode, for the transmission, the data stored in the buffer;
selecting, by the processor, a selected encoding scheme based upon relative sizes of the first bit stream and the second bit stream, the selected encoding scheme being either the first encoding scheme or the second encoding scheme;
determining, by the processor, if a size of a smaller bit stream of the first output bit stream and the second output bit stream exceeds a predetermined size;
decimating, by the processor, the data stored in the buffer if the size of the smaller bit stream exceeds the predetermined size;
re-calculating, by the processor, the first size of the first output bit stream based on the first encoding scheme and the second size of the second output bit stream based on the second encoding scheme to encode, for the transmission, the decimated data stored in the buffer; and
encoding, by the processor, one of the data stored in the buffer and the decimated data stored in the buffer using the selected encoding scheme.

14. The method of claim 13 further comprising further said decimating the decimated data stored in the buffer if the size of the smaller bit stream, of the first output bit stream and the second output bit stream, is greater than the predetermined size.

15. The method of claim 13, further comprising:
further said decimating the decimated data stored in the buffer if the size of the recalculated first and second output bit streams are greater than the predetermined size.

16. A modem for communication in a network via a communication channel, the modem comprising:
a transceiver assembly;
a non-transitory processor readable medium having a buffer storing data samples indicative of one or more measurements from one or more sensors in communication with the transceiver assembly;
transceiver electronics coupled to the transceiver assembly and the non-transitory processor readable medium, the transceiver electronics configured to:

calculate a number of the data samples stored in the buffer able to be encoded into a predetermined budget by a first encoding scheme at each of multiple decimation levels and a second encoding scheme at said each of the multiple decimation levels;

determine which of the first encoding scheme and the multiple decimation levels and the second encoding scheme and the multiple decimation levels enables encoding of a larger number of the number of the data samples within the predetermined budget;

select an encoding scheme of the first encoding scheme and the second encoding scheme, and a decimation level of the multiple decimation levels enabling said encoding of the larger number of the number of data samples within the predetermined budget; and said encoding the larger number of the data samples stored in the buffer using the selected encoding scheme and the selected decimation level; and a power supply supplying power to the transceiver assembly and the transceiver electronics.

17. The modem of claim 16, wherein the first encoding scheme and the second encoding scheme are stored in the non-transitory processor readable medium.

18. The modem of claim 16, wherein the transceiver assembly is a wireless transceiver assembly configured to transmit data to a surface modem along an acoustic wireless network.

* * * * *